United States Patent
Sandu et al.

(10) Patent No.: US 7,538,028 B2
(45) Date of Patent: May 26, 2009

(54) BARRIER LAYER, IC VIA, AND IC LINE FORMING METHODS

(75) Inventors: Gurtej S. Sandu, Boise, ID (US); Bradley J. Howard, Livermore, CA (US)

(73) Assignee: Micron Technology, Inc., Boise, ID (US)

( * ) Notice: Subject to any disclaimer, the term of this patent is extended or adjusted under 35 U.S.C. 154(b) by 200 days.

(21) Appl. No.: 11/497,879

(22) Filed: Jul. 31, 2006

(65) Prior Publication Data

US 2006/0264037 A1    Nov. 23, 2006

Related U.S. Application Data

(63) Continuation of application No. 10/932,156, filed on Sep. 1, 2004, now Pat. No. 7,271,089.

(51) Int. Cl.
*H01L 21/20* (2006.01)

(52) U.S. Cl. .................. 438/638; 438/639; 438/691; 438/692; 438/706; 438/719; 257/E21.058; 257/E21.246; 257/E21.576; 257/E21.577; 257/E21.579

(58) Field of Classification Search .......... 438/637, 438/638, 639, 691, 692, 693, 706, 719; 257/E21.058, 257/246, 256, 576, 577, 579
See application file for complete search history.

(56) References Cited

U.S. PATENT DOCUMENTS

| | | | |
|---|---|---|---|
| 4,226,897 A | 10/1980 | Coleman | |
| 6,140,221 A | 10/2000 | Annapragada et al. | |
| 6,326,302 B1* | 12/2001 | Joubert et al. | 438/638 |
| 6,346,490 B1 | 2/2002 | Catabay et al. | |
| 6,372,670 B1 | 4/2002 | Maeda | |
| 6,537,896 B1 | 3/2003 | Catabay et al. | |
| 6,566,283 B1 | 5/2003 | Pangrle et al. | |
| 6,642,147 B2* | 11/2003 | Dokumaci et al. | 438/691 |
| 6,713,382 B1 | 3/2004 | Pangrle et al. | |
| 7,271,089 B2* | 9/2007 | Sandu et al. | 438/638 |
| 2004/0028916 A1 | 2/2004 | Waldfried et al. | |
| 2004/0121586 A1* | 6/2004 | Abell | 438/637 |
| 2004/0175935 A1 | 9/2004 | Abell | |
| 2005/0184397 A1 | 8/2005 | Gates et al. | |

OTHER PUBLICATIONS

F. Iacopi, "Characterization of Porous Structure in Ultra-Low-k Dielectrics by Depositing Thin Conductive Cap Layers", Microelectronic Engineering, vol. 65, Issues 1-2, pp. 123-131, Jan. 2003.

F. Iacopi, "Dependence of the Minimal PVD TA(N) Sealing Thickness on the Porosity of Zirkon™ LK Dielectric Films", Microelectronic Engineering, vol. 64, Issues 1-4, pp. 351-360, Oct. 2002.

K. Bera, "Effects of Design and Operating Variables on Process Characteristics in a Methane Discharge: A Numerical Study", Plasma Sources Science and Technology, vol. 10, No. 2, pp. 211-225, May 2001.

* cited by examiner

*Primary Examiner*—Michael S Lebentritt
(74) *Attorney, Agent, or Firm*—Wells St. John P.S.

(57) ABSTRACT

A barrier layer forming method includes providing a porous dielectric layer over a substrate, the dielectric layer having a surface with exposed pores, and treating the dielectric layer with a plasma formed from a methane-containing gas. The treating seals the exposed pores. The method includes depositing a barrier layer over the surface, the barrier layer being continuous over the sealed pores. The porous dielectric may be low K. The plasma may be formed at a bias of at least about 100 volts.

18 Claims, 4 Drawing Sheets

BARRIER LAYER, IC VIA, AND IC LINE FORMING METHODS

RELATED PATENT DATA

This patent resulted from a continuation application of U.S. patent application Ser. No. 10/932,156, filed Sep. 1, 2004 now U.S. Pat. No. 7,271,089, and which is incorporated herein by reference.

TECHNICAL FIELD

The invention pertains to barrier layer forming methods and methods for sealing porous dielectric layers, include low K dielectric layers. The invention also pertains to integrated circuit via and line forming methods.

BACKGROUND OF THE INVENTION

Low K materials (referring to materials with a dielectric constant less than that of silicon dioxide) have become increasingly popular in a variety of applications, for example, as interlayer dielectric films (ILD). A number of conventional low K materials are porous in nature, some of which include open pores. The low K materials may be organic, such as SiLK (TM) available from Dow Chemical Co., and/or inorganic, such as porous $SiO_2$-based materials. Black Diamond (R) available from Applied Materials represents a PECVD (plasma-enhanced chemical vapor deposition) deposited $SiC_xO_yN_z$ material that may be low K. It is a generally recognized problem among porous low K materials that deposition of films on the porous structure may yield discontinuous layers. That is, the roughness and/or porosity of the material produce openings in the deposited films that normally would not be present if deposition instead occurred on a non-porous material. Accordingly, a variety of technologies have been developed to address the problems associated with porous low K materials, especially when used as ILD.

However, it will be appreciated that some of the known technologies addressing such problems possess limited application to certain processes and structures and further improvement is desired. Possibilities for improvement include simplified integration into existing processes where porous low K material is used and a reduction in cost of the added processing that addresses discontinuities in porous low K materials.

SUMMARY OF THE INVENTION

In one aspect of the invention, a barrier layer forming method includes providing a porous dielectric layer over a substrate, the dielectric layer having a surface with exposed pores, and treating the dielectric layer with a plasma formed from a methane-containing gas. The treating seals the exposed pores. The method includes depositing a barrier layer over the surface, the barrier layer being continuous over the sealed pores.

In another aspect of the invention, a barrier layer forming method includes providing a porous, low K dielectric layer over a substrate and an opening in the dielectric layer and treating the dielectric layer with a plasma formed from a methane-containing gas. The opening in the dielectric layer has a sidewall including open pores and the treating seals the open pores of the sidewall. The method includes depositing a barrier layer at least over the sidewall, the barrier layer being continuous over the sealed pores. By way of example, the substrate may include an electrical node and the opening may be formed through the dielectric layer to expose the node. An opening formed for a contact via constitutes one example of such an opening. The plasma may be formed at a bias of at least about 100 volts.

In a further aspect of the invention, an integrated circuit via forming method includes forming a porous, low K dielectric layer over a semiconductive substrate including an electrical node, forming a masking layer over the dielectric layer, patterning the masking layer to expose a portion of the dielectric layer, and forming a via opening through the exposed portion of the dielectric layer to expose the node. The opening has a sidewall including open pores. The method includes removing the patterned masking layer and treating the dielectric with a plasma formed from a methane-containing gas at a bias of at least about 100 volts. The treating deposits a carbon layer sealing the open pores of the sidewall, but does not deposit a carbon layer over the node. A barrier layer is deposited by ALD at least over the sidewall, the barrier layer being continuous over the sealed pores. The opening is then filled with metal containing copper and/or aluminum over the barrier layer and in electrical connection with the node. The metal fill forms a conductive via to the node.

In a still further aspect of the invention, an integrated circuit line forming method includes forming a porous, low K dielectric layer over a semiconductive substrate, forming a masking layer over the dielectric layer, patterning the masking layer to expose a portion of the dielectric layer, and forming a trench in the exposed portion of the dielectric layer, the trench having sidewalls and a bottom including pores. The method includes removing the patterned masking layer and treating the dielectric layer with a plasma formed from a methane-containing gas. The treating deposits a carbon layer sealing the open pores of the sidewalls and bottom. A barrier layer is formed by ALD at least over the sidewalls and bottom, the barrier layer being continuous over the sealed pores. The trench is filled with metal containing copper and/or aluminum over the barrier layer. The metal fill forms a conductive line extending across the dielectric layer and connecting electrical nodes. By way of example, the patterned masking layer may be removed before the treating or, alternatively, removed after the treating.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
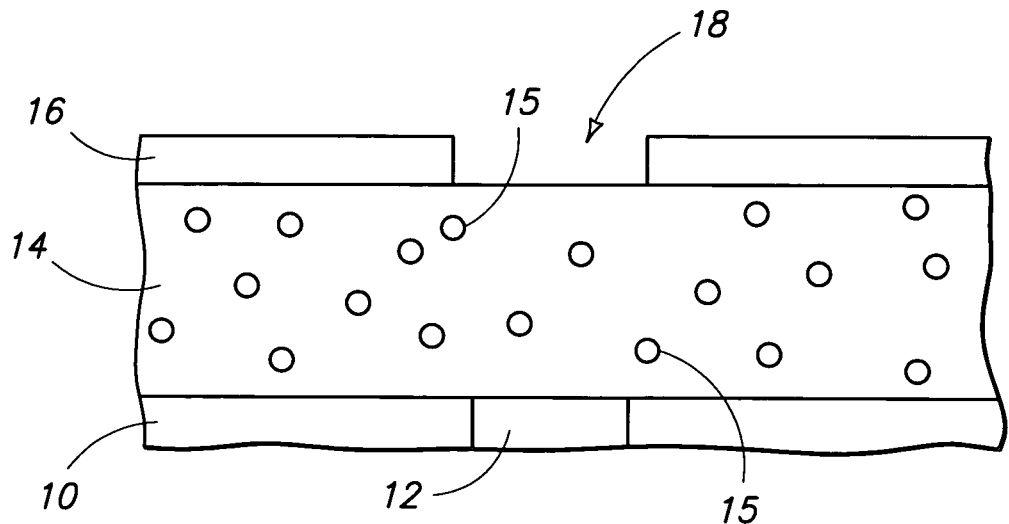
FIG. 1 is a partial, sectional view of a substrate in process including a porous dielectric according to one aspect of the invention.

Although a general recognition exists of problems associated with film deposition over porous materials, observation has revealed a particular difficulty with atomic layer deposition (ALD) barrier layers on porous materials. Without being limited to any particular theory, a belief exists that ALD precursors may penetrate within the pores of porous materials and deposit on or modify surfaces inside such materials. Given the cyclic nature of ALD, cycle time may be insufficient for precursors to diffuse into pores and to form completed layers on all of the internal surfaces. Particular difficulty is believed to exist with open pore types of such materials since deeper penetration may be possible. Open pore materials generally include interconnected pores or cavities and may be contrasted with closed cell materials, the pores of which are not interconnected. It will be appreciated that thin ALD barrier layers may thus possess discontinuities at the locations where precursors penetrate into pores of the material.

ALD involves formation of successive atomic layers on a substrate. Such layers may include an epitaxial, polycrystalline, amorphous, etc. material. ALD may also be referred to as atomic layer epitaxy, atomic layer processing, etc. Described in summary, ALD includes exposing an initial substrate to a first chemical precursor to accomplish chemisorption of the precursor onto the substrate. Theoretically, the precursor forms a monolayer that is uniformly one atom or molecule thick on the entire exposed initial substrate. In other words, a saturated monolayer. Practically, chemisorption might not occur on all portions of the substrate. Nevertheless, such an imperfect monolayer is still a monolayer in the context of this document. The first precursor is purged from over the substrate and a second chemical precursor is provided to react with the first monolayer of the first precursor. The second precursor is then purged and the steps are repeated with exposure of the deposited monolayer to the first precursor. As an option, the second precursor can react with the first precursor, but not chemisorb additional material thereto. Also, a third precursor or more may be successively chemisorbed (or reacted) and purged just as described for the first and second precursors.

Given the potentially intricate topography of surfaces within open pores, it may be unlikely for a uniformly thick barrier layer to form on all surfaces within the pores. Instead, the porosity of such materials may yield defects in the deposited layers intended to act as barriers. A common purpose for ALD barrier layers formed over low K dielectrics includes prevention of copper and/or aluminum migration into the dielectric material from conductive material. The low K and other properties of porous low K materials provide superior ILD in some applications. Accordingly, contact vias formed through the ILD and conductive lines formed across the ILD may contain copper and/or aluminum susceptible to migration into the ILD unless a barrier layer is provided. A defective barrier layer may allow unwanted penetration of copper and/or aluminum into the ILD. Since the ILD may be separating conductive features, such as conductive lines, conceivably the defective barrier layer may yield shorts between the features. Even though the aspects of the invention described herein are particularly suitable for low K porous dielectrics and ALD of barrier layers, it should appreciated that such aspects may also be applicable to porous dielectric materials that are not low K and formation of barrier layers by other methods, such as chemical vapor deposition (CVD).

The general technology of CVD includes a variety of more specific processes, including, but not limited to plasma enhanced CVD and others. CVD is commonly used to form non-selectively a complete, deposited material on a substrate. One characteristic of CVD is the simultaneous presence of multiple precursors in the deposition chamber that react to form the deposited material. Such condition is contrasted with the purging criteria for traditional ALD wherein a substrate is contacted with a single deposition precursor that chemisorbs to a substrate or reacts with a previously deposited precursor.

According to one aspect of the invention, a barrier layer forming method includes providing a porous dielectric layer over a substrate, the dielectric layer having a surface with exposed pores, and treating the dielectric layer with a plasma formed from a methane-containing gas. The treating seals the exposed pores. The method includes depositing a barrier layer over the surface, the barrier layer being continuous over the sealed pores. By way of example, the exposed pores may include open pores. Also, the surface may constitute a sidewall of an opening in the dielectric layer. The barrier layer may be deposited on and in contact with the sealed surface. The barrier layer may have a thickness of from about 10 to about 150 Angstroms. Preferably, the barrier layer has a thickness of from about 10 to about 50 Angstroms. Notably, a barrier layer within the preferred thickness range typically deposits on porous dielectric with defects that allow penetration of materials otherwise blocked by the barrier layer and may yield an electric short.

According to another aspect of the invention, a barrier layer forming method includes providing a porous, low K dielectric layer over a substrate and an opening in the dielectric layer and treating the dielectric layer with a plasma formed from a methane-containing gas. The opening in the dielectric layer has a sidewall including open pores and the treating seals the open pores of the sidewall. The method includes depositing a barrier layer at least over the sidewall, the barrier layer being continuous over the sealed pores. By way of example, the substrate may include an electrical node and the opening may be formed through the dielectric layer to expose the node. An opening formed for a contact via constitutes one example of such an opening. The electrical node may be a metal contact, a diffusion region, or other similar structure known to those of ordinary skill. The barrier layer may be deposited on and in contact with the sealed sidewall and electrical node.

As another alternative, the opening may have sidewalls and a bottom including open pores, sealing may include sealing the open pores of the sidewalls and bottom, and the barrier may be deposited at least over the sidewalls and bottom. The barrier layer may be deposited on and in contact with the sealed sidewalls and bottom. A trench formed for a conductive line constitutes one example of such an opening. As a further alternative, the opening may have multiple portions with different structural features.

Accordingly, the substrate may include an electrical node, a first portion of the opening may be formed through the dielectric layer to expose the node and have a sidewall including open pores, and a second portion of the opening may extend laterally from the first portion and have sidewalls and a bottom including opening pores. Sealing may include sealing the open pores of the sidewall in the first portion of the opening and sealing the open pores of the sidewalls and bottom in the second portion of the opening. An opening formed for a contact via and a trench extending therefrom for a conductive line constitute one example of an opening with the described first and second portions. It should be noted that the sealing in the first portion and the sealing in the second portion can occur separately. Instead, the sealing in the first portion and the sealing in the second portion can occur simultaneously.

A variety of processing alternatives exist that are encompassed by the aspects of the invention. For example, forming the opening can include a dual damascene process and provide a trench and a via opening. Dual damascene processes are well known in the art. Treatment with the plasma formed from a methane-containing gas may deposit a carbon layer, sealing the open pores. The carbon layer may have a thickness of from about 10 to about 100 Angstroms or, preferably, from about 20 to about 50 Angstroms. The methane-containing gas may consist of methane and, optionally, an inert carrier gas. It should be appreciated that the methane-containing gas may instead contain other components. However, preferably the methane-containing gas does not contain a halogen. Methane constitutes a preferred component of the gas used to form the plasma since byproducts of such process include hydrogen, and possibly some carbon. Including hydrohalocarbon components, such as $CHF_3$, or halocarbon components such as $CF_4$ in the methane-containing gas yields halogen byproducts which are more problematic at least from a halogen contamination and byproduct handling standpoint.

As another process consideration, the plasma may be formed at a bias of at least about 100 volts. Such a bias causes enough ion bombardment of horizontal surfaces to essentially provide directional etching of such surfaces during deposition on vertical surfaces. Accordingly, operational parameters of treatment with the plasma can be selected so as to selectively seal vertical sidewalls of openings without sealing horizontal surfaces subjected to the directional etching. Even so, it will be appreciated that in some circumstances it may be desirable to seal both the sidewalls and bottom of openings, such as trenches for conductive lines, and a bias of at least about 100 volts will not be desirable. Operational parameters for plasma deposition of carbon are well known in the art as may be appreciated from review of Bera et al, "Effects of Design and Operating Variables on Process Characteristics in a Methane Discharge: A Numerical Study," Plasma Sources Science Technology, Vol. 10, pgs. 211-225, 2001 which provides a detailed evaluation of various methane plasma operational parameters and their effects.

One advantage of the aspects of the invention described herein includes the ability to fill the treated opening with metal containing copper and/or aluminum over the barrier layer such that the barrier layer allows less penetration of the metal into the dielectric layer compared to an otherwise identical barrier layer formed without the treating. The metal fill thus formed may be a conductive via or the metal fill may be a conductive line extending across the dielectric layer and connecting electrical nodes. Exemplary barriers include but are not limited to titanium, titanium nitride, tantalum, tantalum nitride, tungsten, tungsten nitride, ruthenium, ruthenium nitride, or combinations thereof. The metal fill may consist of copper and/or aluminum.

According to a further aspect of the invention, an integrated circuit via forming method includes forming a porous, low K dielectric layer over a semiconductive substrate including an electrical node, forming a masking layer over the dielectric layer, patterning the masking layer to expose a portion of the dielectric layer, and forming a via opening through the exposed portion of the dielectric layer to expose the node. The opening has a sidewall including open pores. The method includes removing the patterned masking layer and treating the dielectric with a plasma formed from a methane-containing gas at a bias of at least about 100 volts. The treating deposits a carbon layer sealing the open pores of the sidewall, but does not deposit a carbon layer over the node. A barrier layer is deposited by ALD at least over the sidewall, the barrier layer being continuous over the sealed pores. The opening is then filled with metal containing copper and/or aluminum over the barrier layer and in electrical connection with the node. The metal fill forms a conductive via to the node.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Processing options include removing the patterned masking layer before the treatment with plasma or, alternatively, removing the patterned masking layer after the treatment. The masking layer may include a photoresist and/or other known materials. Forming the via opening may include a dual damascene process and further provide a trench. In dual damascene processing, the metal fill may further form a conductive line in the trench extending across the dielectric layer and connecting electrical nodes.

Figure 6:
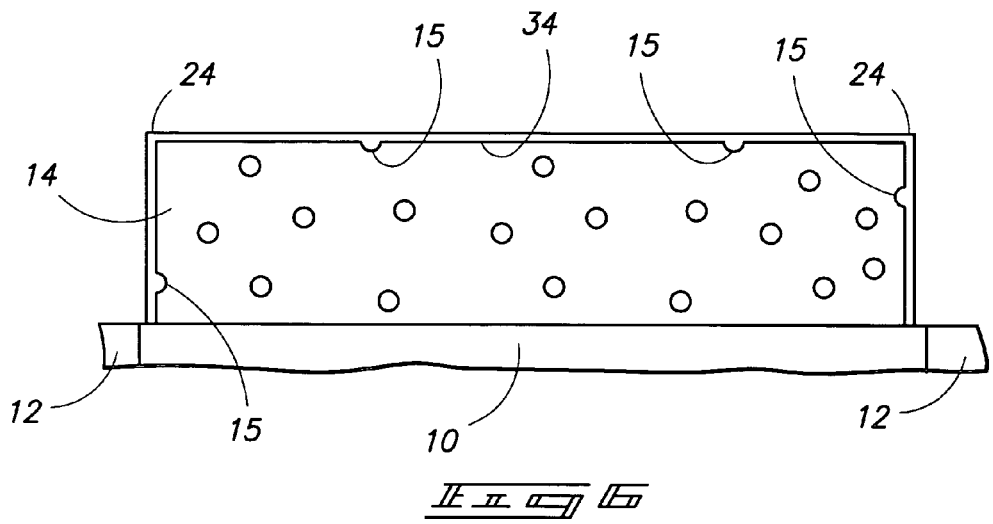
FIG. 6 is a partial, sectional view taken along line 6-6 shown in FIG. 8 of a substrate in process according to another aspect of the invention.
Figure 7:
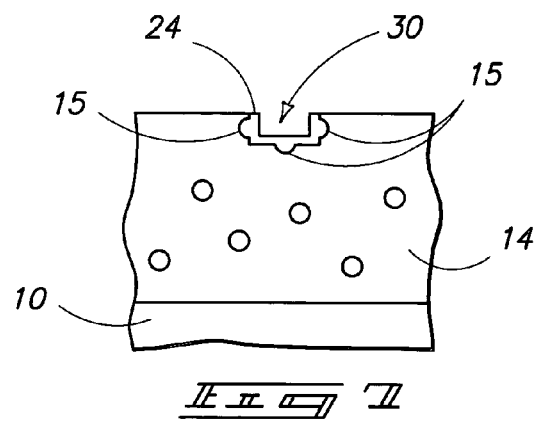
FIG. 7 is a partial, sectional view taken along line 7-7 shown in FIG. 8.
Figure 8:
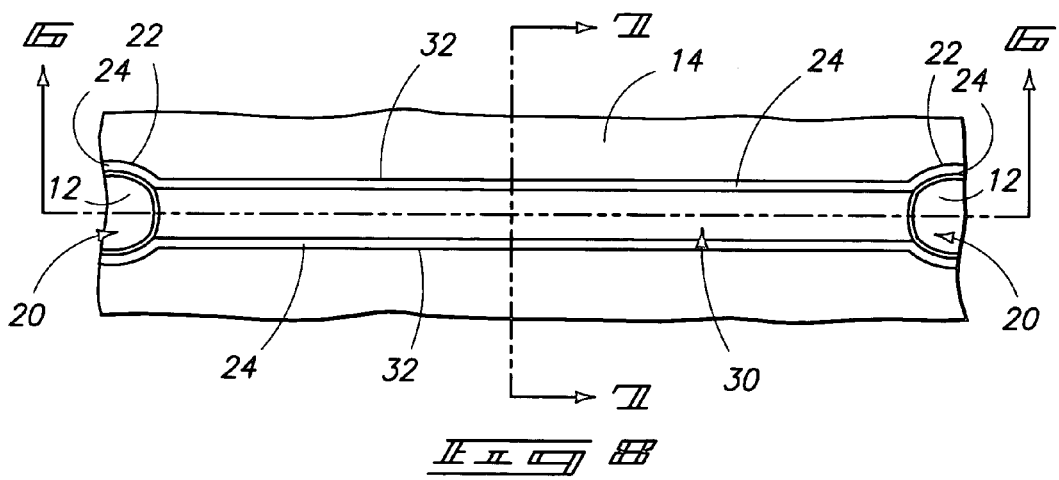
FIG. 8 is a top view of the substrate shown in FIGS. 6 and 7.

In a dual damascene process, and perhaps other types of processing, it is possible that some of the carbon layer may deposit on the electrical node. A cleaning step with directional plasma etching may be used to clean the carbon layer from the electrical node. Other directional etching may be suitable as well. The etching may leave the pores sealed on horizontal surfaces of the low K dielectric at the bottom of trenches. It is likely that the thickness of the carbon layer on the low K dielectric at the trench bottom is greater than the thickness of the carbon layer on the electrical node. Also, as may be appreciated from FIGS. 5B and 5C, depositing the carbon layer effectively results in a thicker carbon film over the pores in comparison to the nonporous surfaces between pores. This is also true of pores at the bottom of trenches, such as shown in FIGS. 6-8. Thus, some of the carbon layer thickness may be removed without opening the sealed pores.

According to a still further aspect of the invention, an integrated circuit line forming method includes forming a porous, low K dielectric layer over a semiconductive substrate, forming a masking layer over the dielectric layer, patterning the masking layer to expose a portion of the dielectric layer, and forming a trench in the exposed portion of the dielectric layer, the trench having sidewalls and a bottom including pores. The method includes removing the patterned masking layer and treating the dielectric layer with a plasma formed from a methane-containing gas. The treating deposits a carbon layer sealing the open pores of the sidewalls and bottom. A barrier layer is formed by ALD at least over the sidewalls and bottom, the barrier layer being continuous over the sealed pores. The trench is filled with metal containing copper and/or aluminum over the barrier layer. The metal fill forms a conductive line extending across the dielectric layer and connecting electrical nodes. By way of example, the patterned masking layer may be removed before the treating or, alternatively, removed after the treating.

Figure 2:
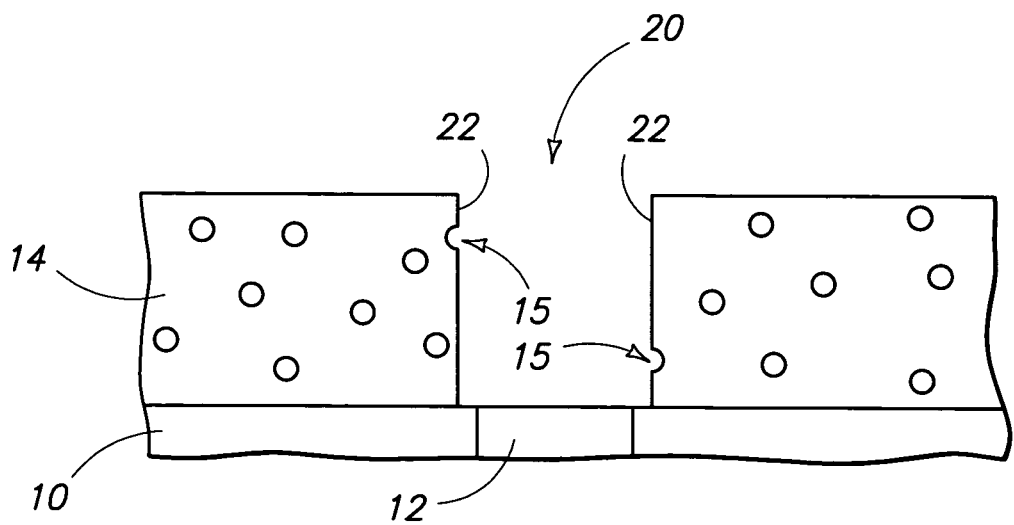
FIG. 2 is a partial, sectional view of the FIG. 1 substrate at a subsequent process step.

FIG. 1 shows a substrate 10 in process demonstrating aspects of the invention. Substrate 10 includes a node 12 formed therein with a porous dielectric 14 formed over substrate 10. Porous dielectric 14 includes pores 15 represented schematically in the Figures without limitation as to their size. A patterned masking layer 16 is over porous dielectric 14 and includes an opening 18 exposing the underlying porous dielectric 14. Etching and mask removal provide the structure shown in FIG. 2 with an opening 20 through porous dielectric 14 exposing node 12. Opening 20 includes a sidewall 22 with pores 15 exposed therein. It will be appreciated that a barrier layer formed over sidewall 22 may exhibit discontinuities at pores 15 for the reasons described herein.

Figure 3:
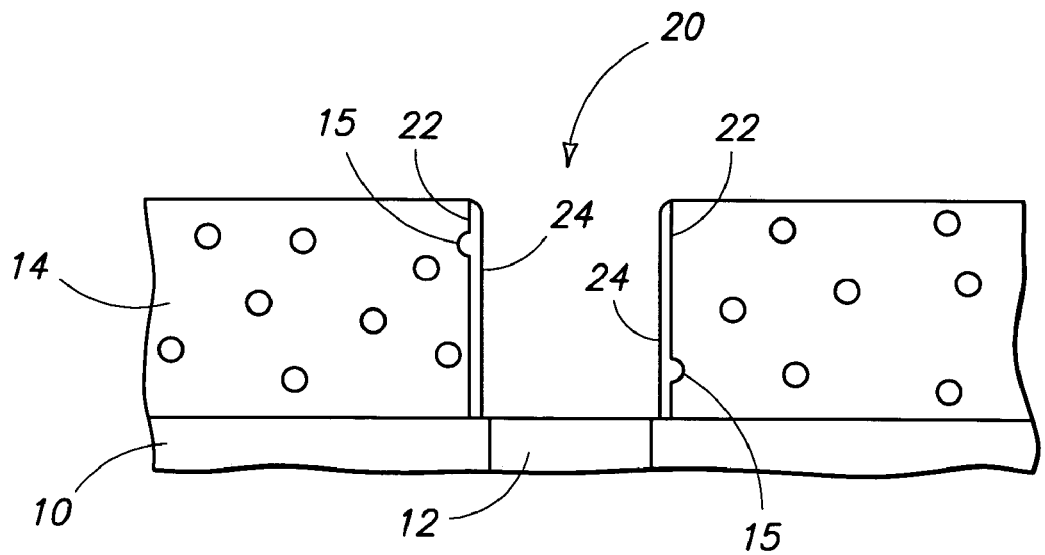
FIG. 3 is a partial, sectional view of the FIG. 2 substrate at a subsequent process step.
Figure 4:
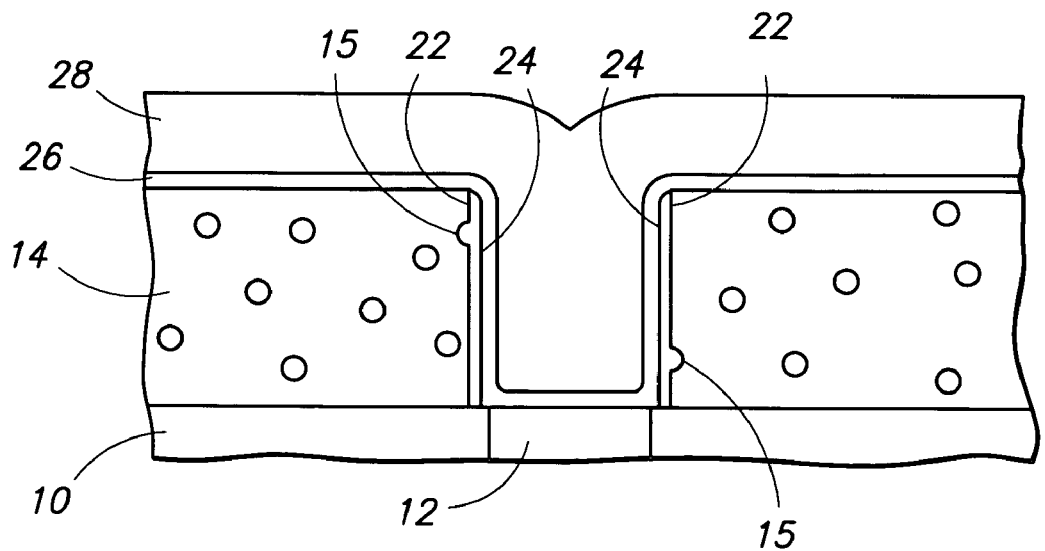
FIG. 4 is a partial, sectional view of the FIG. 3 substrate at a subsequent process step.

According to FIG. 3, treating porous dielectric 14 with a plasma formed from a methane-containing gas at a bias of at least about 100 volts forms a carbon layer 24 on sidewall 22 but does not form carbon layer 24 on node 12 or the upper horizontal surfaces of porous dielectric 14. As an alternative, carbon layer 24 may be formed non-selectively on the surfaces shown in FIG. 3. Turning to FIG. 4, a barrier layer 26 is shown over sidewall 22, node 12, and horizontal surfaces of porous dielectric 14. A metal fill 28 fills opening 20 with metal. As known to those of ordinary skill, subsequent chemical-mechanical polishing may be used to form a conductive structure within opening 20 resembling a contact via. It is likely in such polishing to remove the portions of barrier layer 26 and metal fill 28 at an elevational level above porous dielectric 14. Alternatively, it is conceivable that portions of barrier layer 26 and metal fill 28 above such elevational level may remain to form conductive lines.

Figure 5A:
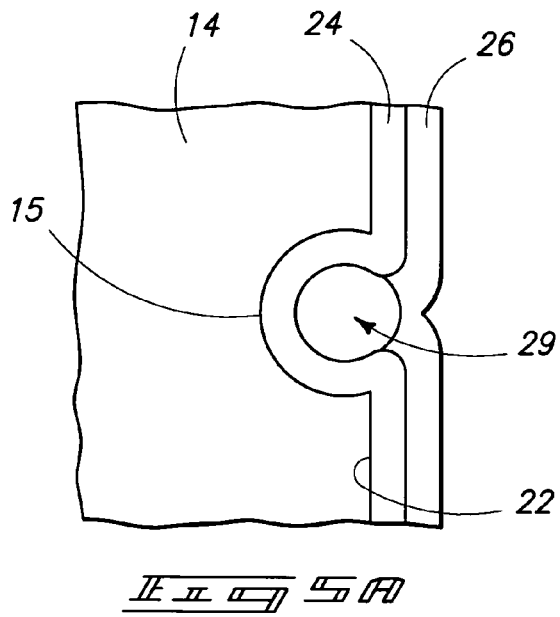
FIGS. 5A-5C are enlarged sectional views of a porous dielectric sidewall corresponding to the process step shown in FIG. 4.
Figure 5C:
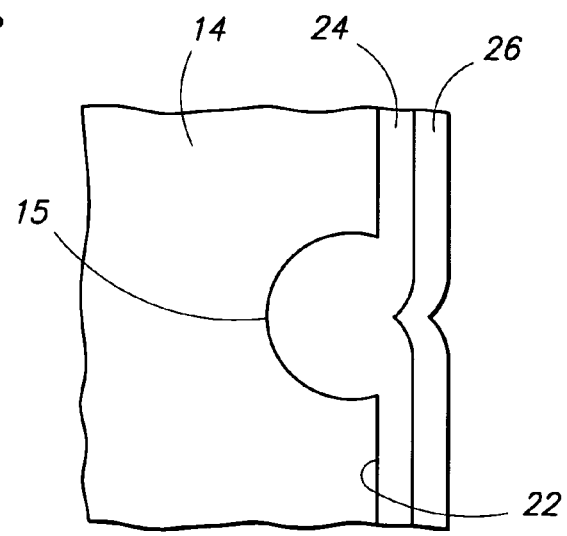
Figure 5B:
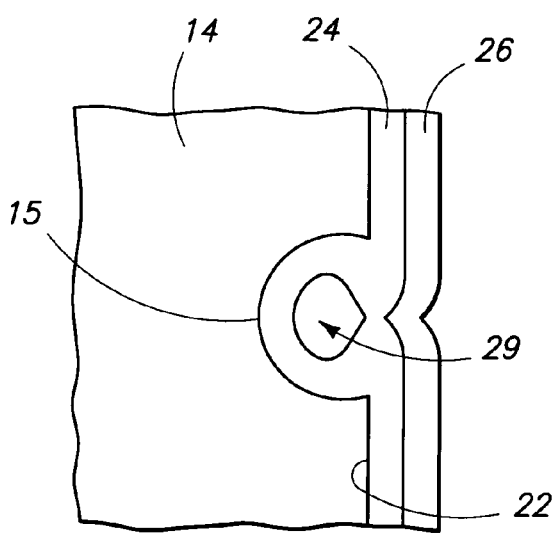

FIGS. 5A-5C provide possible explanations of how carbon layer 24 may help inhibit penetration of metals from metal fill 28 through barrier layer 26 to porous dielectric 24. In FIG. 5A, carbon layer 24 deposits conformally on porous dielectric 14 including within pore 15. However, the added thickness of carbon layer 24 sufficiently closes the opening into pore 15 such that subsequently deposited barrier layer 26 closes off the opening into pore 15, yielding a void 29 but producing a continuous barrier layer. In FIG. 5B, carbon layer 24 also deposits conformally but has sufficient thickness to completely close pore 15, leaving a void 29 therein. Barrier layer 26 subsequently deposits without any discontinuity over pore 15. In FIG. 5C, carbon layer 24 deposits conformally and fills pore 15 without producing a void. Thereafter, barrier layer 26 deposits conformally and continuously over pore 15.

It should be appreciated that a variety of other possibilities exist wherein carbon layer 24 seals pore 15 or closes the opening into pore 15 sufficiently such that barrier layer 26 deposits conformally and continuously over pore 15. For example, carbon layer 24 may deposit without forming a conformal layer within pore 15, but nevertheless sealing or sufficiently closing pore 15 to accomplish the desired effect. A wide variety of specific structural features may result from such circumstance so it is not demonstrated in the drawings. However, those of ordinary skill can appreciate the possibilities once given the aspects of the invention described herein. Understandably, the aspects of the invention are not limited to any particular theory or structure whereby carbon layer 24 is sufficient to reduce discontinuities other than expressly stated.

FIGS. 6-8 show an alternative aspect of the invention where like numerals designate like materials and/or structural features to those shown in FIGS. 1-4. Essentially, FIG. 6-8 show openings 20 through porous dielectric 14 exposing nodes 12 formed in substrate 10. Another opening 30 extends across porous dielectric 14 connecting openings 20. As may be appreciated from the sectional views in FIGS. 6 and 7 and the top view in FIG. 8, carbon layer 24 is over sidewall 24 of openings 20 as well as over sidewalls 32 and a bottom 34 of opening 30. Accordingly, carbon layer 24 advantageously reduces subsequent discontinuities in a barrier layer formed over pores 15 whether existent in sidewall 22 of opening 20 or sidewalls 32 or bottom 34 of opening 30. Accordingly, FIGS. 6-8 provide one example of incorporating the aspects of the invention into via openings and trenches generated in a dual damascene process. According to the dual damascene technique, metal fill in trenches and via openings simultaneously followed by chemical-mechanical polishing yield contact vias and interconnecting metal lines.

Some of the advantages of the plasma treatments with a methane-containing gas according to the aspects of the invention described herein include its simplicity and wide application to a variety of structural features formed in porous dielectric material. Such plasma treatment may be carried out in situ in the same chamber as the etching of openings and stripping of patterned masking layers or in a separate chamber. The invention is applicable both to via openings as well as trenches.

While some discussion exists in the art of merely increasing barrier layer thickness to remedy discontinuities created over pores in porous dielectrics, such an approach may warrant reengineering of via opening and trench dimensions to accommodate the thicker barrier layers. It may also add to the time and cost of depositing barrier layers. Also, a significant advantage exists in forming barrier layers by ALD. As known to those of ordinary skill, such advantages justify the added equipment and potentially more costly and time consuming processing potentially associated with ALD. However, if ALD barrier layers must be formed thick enough to reduce discontinuities over pores in porous dielectrics, then the additional cost and processing time may shift desirability to other deposition methods. Accordingly, the simple, quick, low-cost plasma treatment described herein allows sealing of pores in porous dielectrics without abandoning the advantages provided by ALD. Additionally, redesigning dimensions of via openings and trenches, or other structural features, might be avoided. At least for the reasons indicated herein, those of ordinary skill will appreciate the unique advancements in the art provided by the aspects of the inventions described herein.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A barrier layer forming method comprising:
   providing a porous dielectric layer over a substrate;
   forming an opening in the dielectric layer, the opening having a sidewall and a bottom, the sidewall having exposed pores;
   treating the dielectric layer with a plasma formed from a methane-containing gas, the treating sealing the exposed pores of the sidewall, but not sealing the bottom; and
   depositing a barrier layer at least over the sidewall, the barrier layer exhibiting fewer discontinuities over the sealed pores in comparison to an otherwise identical barrier layer deposited without the treating.

2. The method of claim 1 wherein the exposed pores comprise open pores.

3. The method of claim 1 wherein:
   the substrate includes an electrical node;
   a first portion of the opening extends through the dielectric layer to expose the node and has a sidewall including open pores;

a second portion of the opening extends laterally from the first portion and has sidewalls and a bottom including open pores; and sealing comprises sealing the open pores of the sidewall in the first portion of the opening and sealing the open pores of the sidewalls and bottom in the second portion of the opening.

4. The method of claim 3 wherein sealing in the first portion and sealing in the second portion occur simultaneously.

5. The method of claim 1 further comprising providing a metal fill in the opening with metal containing copper and/or aluminum over the barrier layer, the barrier layer allowing less penetration of the metal into the dielectric layer compared to an otherwise identical barrier layer deposited without the treating.

6. The method of claim 5 wherein the metal fill forms a conductive via.

7. The method of claim 5 wherein the metal fill forms a conductive line extending across the dielectric layer and connecting electrical nodes.

8. The method of claim 1 wherein providing the opening comprises a dual damascene process and provides a trench and a via opening.

9. The method of claim 1 wherein the plasma is formed at a bias of at least about 100 volts.

10. The method of claim 1 wherein the treating deposits a carbon layer, sealing the open pores.

11. The method of claim 1 wherein the methane-containing gas does not comprise a halogen.

12. The method of claim 1 wherein the methane-containing gas consists of methane and, optionally, an inert carrier gas.

13. The method of claim 1 wherein depositing the barrier layer comprises atomic layer deposition.

14. The method of claim 1 wherein depositing the barrier layer comprises chemical vapor deposition.

15. The method of claim 1 wherein the barrier layer comprises titanium, titanium nitride, tantalum, tantalum nitride, or combinations thereof.

16. An integrated circuit via forming method comprising:
providing a porous, low K dielectric layer over a semiconductive substrate including an electrical node;
forming a masking layer over the dielectric layer and patterning the masking layer to expose a portion of the dielectric layer;
forming a via opening through the exposed portion of the dielectric layer to expose the node, the opening having a sidewall including open pores;
removing the patterned masking layer;
treating the dielectric layer with a plasma formed from a methane-containing gas at a bias of at least about 100 volts, the treating depositing a carbon layer sealing open pores of the sidewall but not depositing a carbon layer over the node;
atomic layer depositing a barrier layer at least over the sidewall, the barrier layer exhibiting fewer discontinuities over the sealed pores in comparison to an otherwise identical barrier layer deposited without the treating; and
filling the opening with metal containing copper and/or aluminum over the barrier layer and in electrical connection with the node, the metal fill forming a conductive via to the node and the barrier layer allowing less penetration of the metal into the dielectric layer compared to an otherwise identical barrier layer deposited without the treating.

17. The method of claim 16 wherein forming the via opening comprises a dual damascene process and further provides a trench.

18. The method of claim 17 wherein the metal fill further forms a conductive line in the trench extending across the dielectric layer and connecting electrical nodes.

* * * * *

UNITED STATES PATENT AND TRADEMARK OFFICE
CERTIFICATE OF CORRECTION

PATENT NO. : 7,538,028 B2
APPLICATION NO. : 11/497879
DATED : May 26, 2009
INVENTOR(S) : Gurtej S. Sandhu et al.

Page 1 of 1

It is certified that error appears in the above-identified patent and that said Letters Patent is hereby corrected as shown below:

On the title page, under item (12) "Sandu et al." should read -- Sandhu et al. --.

On the title page, in item (75), in "Inventors", in column 1, line 1, delete "S. Sandu," and insert -- S. Sandhu --, therefor.

Signed and Sealed this

Fourth Day of August, 2009

JOHN DOLL
*Acting Director of the United States Patent and Trademark Office*